United States Patent
Sarihan

(10) Patent No.: US 8,148,206 B2
(45) Date of Patent: Apr. 3, 2012

(54) PACKAGE FOR HIGH POWER INTEGRATED CIRCUITS AND METHOD FOR FORMING

(75) Inventor: Vijay Sarihan, Paradise Valley, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 12/606,585

(22) Filed: Oct. 27, 2009

(65) Prior Publication Data

US 2011/0095416 A1    Apr. 28, 2011

(51) Int. Cl.
*H01L 21/00* (2006.01)
(52) U.S. Cl. .................... 438/121; 438/127
(58) Field of Classification Search .............. 438/108, 438/121, 123, 127, 611, 622
See application file for complete search history.

(56) References Cited

U.S. PATENT DOCUMENTS

| | | | |
|---|---|---|---|
| 4,546,405 A | 10/1985 | Hultmark et al. | |
| 5,049,978 A * | 9/1991 | Bates et al. | 257/686 |
| 6,204,562 B1 | 3/2001 | Ho et al. | |
| 6,424,032 B1 * | 7/2002 | Ikemoto et al. | 257/691 |
| 6,507,110 B1 * | 1/2003 | Chai et al. | 257/728 |
| 6,709,897 B2 | 3/2004 | Cheng et al. | |
| 6,838,776 B2 | 1/2005 | Leal et al. | |
| 6,921,975 B2 | 7/2005 | Leal et al. | |
| 7,264,995 B2 | 9/2007 | Kim | |
| 7,384,819 B2 | 6/2008 | Yip et al. | |
| 7,569,423 B2 | 8/2009 | Kwon et al. | |
| 2008/0054448 A1 | 3/2008 | Lu et al. | |
| 2008/0099917 A1 | 5/2008 | Jiang et al. | |
| 2009/0032933 A1 | 2/2009 | Tracht et al. | |

OTHER PUBLICATIONS

Keser, B., "Redistributed Chip Packaging", Semiconductor International, Apr. 1, 2007.

* cited by examiner

*Primary Examiner* — S. V Clark
(74) *Attorney, Agent, or Firm* — Daniel D. Hill

(57) ABSTRACT

A method for packaging an integrated circuit comprises the steps of: providing a ground plane, the ground plane having a recessed area shaped to receive an integrated circuit die, wherein the integrated circuit die having a first surface with active circuitry, a second surface, and an edge generally orthogonal to the first and second surfaces; attaching the second surface of the integrated circuit die to a bottom of the recessed area with a thermally conductive adhesive; filling a space between the edge of the integrated circuit die and a side of the recessed area with a fill material; forming an insulating layer on the ground plane and the first surface of the integrated circuit die; patterning the insulating layer to expose contacts on the first surface of the integrated circuit die; and plating electrical conductors on the insulating layer and the contacts.

20 Claims, 5 Drawing Sheets

PACKAGE FOR HIGH POWER INTEGRATED CIRCUITS AND METHOD FOR FORMING

BACKGROUND

1. Field

This disclosure relates generally to integrated circuits, and more specifically, to a package for high power integrated circuits and method for forming.

2. Related Art

Integrated circuit devices are typically formed from a silicon wafer, singulated into individual die, and then packaged. The packaging is intended to protect the device while still allowing the device to be connected to a printed circuit board (PCB). In an effort to manufacture increasingly smaller packaged devices at lower cost, various techniques have been developed. One of those techniques is known as redistributed chip packaging (RCP).

In RCP, much of the packaging process is performed simultaneously on multiple die. A disposable substrate is first provided. An embedded ground plane (EGP) is then fixed to the disposable substrate with an adhesive. The EGP is typically formed from a conductive material, such as copper, and includes a plurality of openings. Each of the plurality of openings is for receiving one or more integrated circuit die. The integrated circuit die are placed in the openings of the EGP and fixed to the substrate with their active sides down. An encapsulant mold frame is placed around the perimeter of the EGP. A panelization step is performed by pouring a liquid mold compound over the EGP and integrated circuit die within the mold frame. The mold compound is then cured and leveled. After panelization, the mold frame, substrate, and adhesive are removed. The EGP and die are turned upside down so that the active sides of the die are exposed. Interconnects comprising alternating layers of an insulating material and metal are then constructed on the die using photolithography and plating. Solder balls are formed, or dropped, on the final metallization layer for making electrical connections to a PCB. The packaged integrated circuits are then separated from each other by cutting through designated areas.

Using RCP provides a method for packaging single or multiple die that is smaller and more cost effective than many other packaging techniques. Also, RCP eliminates wire bonds, package substrates and flip chip bumps. However, RCP has limited heat transfer capability.

Therefore, what is needed is a method that solves the above problems while maintaining the advantages of RCP.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
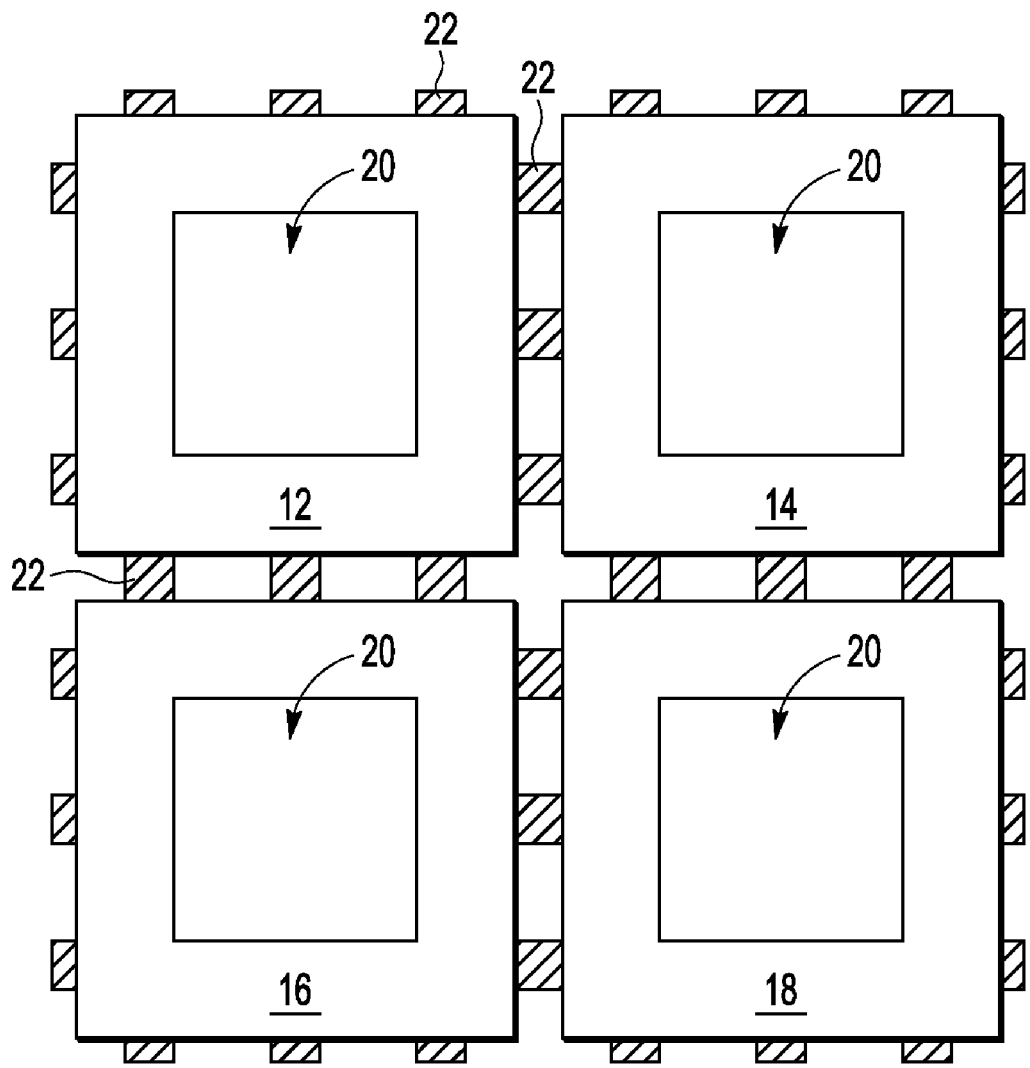
FIG. 1 illustrates a top down view of a portion of an embedded ground plane frame in accordance with the prior art.

Generally, there is provided, a packaged device and a method for forming the packaged device. The device comprises a ground plane having a recessed area for receiving an integrated circuit die. The recessed area may comprise a stamped cap portion coupled to the ground plane via a plurality of tabs. In one embodiment, the integrated circuit die is attached to the cap inside the recessed area with a thermally conductive adhesive. An active surface of the integrated circuit die faces outward from the recessed area. Gaps between the edges of the die and sides of the recessed area are filled with a fill material such as epoxy. Interconnect layers comprising patterned dielectric layers and electrical conductors are formed on the ground plane, the filled gap between the die and the ground plane, and the active surface of the die. Solder balls are formed on the final interconnect layer for connection to a printed circuit board.

The packaged device provides protection to the die and increased package stiffness. Also, panelization can be used but is not necessary. In addition, the ground plane provides good heat transfer for high power devices. In another embodiment, for additional stiffness without panelization and for better heat transfer, fins, grooves, channels, or furrows, can be formed in the ground plane.

In one aspect, there is provided, a method for packaging an integrated circuit, the method comprising: providing a ground plane, the ground plane having a recessed area shaped to receive an integrated circuit die, wherein the integrated circuit die having a first surface with active circuitry, a second surface, and an edge generally orthogonal to the first and second surfaces; attaching the second surface of the integrated circuit die to a bottom of the recessed area with a thermally conductive adhesive; filling a space between the edge of the integrated circuit die and a side of the recessed area with a fill material; forming an insulating layer on the ground plane and the first surface of the integrated circuit die; patterning the insulating layer to expose contacts on the first surface of the integrated circuit die; and plating electrical conductors on the insulating layer and the contacts. The method may further comprise using a stamping process to form the recessed area in the ground plane. The recessed area may further comprise a cap portion connected to the ground plane with a plurality of tabs. The method may further comprise forming an encapsulant layer at least partially over a side of the ground plane opposite the plated electrical conductors. The encapsulant layer may cover all of the side of the ground plane. The method may further comprise using a stamping process to form fins and the recessed area on the ground plane. The ground plane may be corrugated. The ground plane may comprise a metal. The method may further comprise forming solder balls electrically coupled to the electrical conductors.

In another aspect, there is provided, a method for packaging an integrated circuit, the method comprising: providing a substrate having a surface; attaching an integrated circuit die to the substrate, the integrated circuit die having a first surface with active circuitry, a second surface, and an edge generally orthogonal to the first and second surfaces; coupling a ground plane to the substrate and to the second surface of the integrated circuit die, the ground plane having a recessed area shaped to receive the integrated circuit die; filling a space between the edge of the integrated circuit die and a side of the recessed area with a fill material; removing the substrate from the integrated circuit die and from the ground plane; forming an insulating layer on the ground plane and the first surface of the integrated circuit die; patterning the insulating layer to expose contacts on the first surface of the integrated circuit die; and plating electrical conductors on the insulating layer and the contacts. The step of coupling the ground plane to the substrate and to the second surface of the integrated circuit die may further comprise attaching the second surface of the integrated circuit die to a bottom of the recessed area with a thermally conductive adhesive. The method may further comprise using a stamping process to form the recessed area in the ground plane. The recessed area may further comprise a cap portion connected to the ground plane with a plurality of tabs. The method may further comprise forming fins on the ground plane. The ground plane may be corrugated.

In yet another aspect, there is provided, a device, comprising: a ground plane comprising a first side and a second side opposite the first surface, the ground plane further comprising a recessed area, the recessed area open on the first side, the second side of the ground plane comprising a cap for closing the recessed area on the second side, wherein the cap is coupled to the ground plane with a plurality of tabs; an integrated circuit die having a first surface with active circuitry, a second surface, and an edge generally orthogonal to the first and second surfaces, the second surface of the integrated circuit die attached to the cap inside the recessed area with a thermally conductive material; a fill material deposited in a space between the edge of the integrated circuit die and the plurality of tabs; a patterned insulating layer formed on the first side of the ground plane and on the first surface of the integrated circuit die; and a plurality of electrical conductors formed over the patterned insulating layer and coupled to the integrated circuit die. The fins may be formed on the first second side of the ground plane. The device may further comprise an encapsulant layer at least partially over the second side of the ground plane. The ground plane may comprise a metal. The device may further comprise a plurality of solder balls electrically coupled to the electrical conductors.

The integrated circuit described herein can be formed from any semiconductor material or combinations of materials, such as gallium arsenide, silicon germanium, silicon-on-insulator (SOI), silicon, monocrystalline silicon, the like, and combinations of the above.

FIG. 1 illustrates a top down view of a portion of EGP frame 10 in accordance with the prior art. EGP frame 10 is formed from a sheet of copper and includes a plurality of ground planes, such as ground planes 12, 14, 16, and 18. Ground planes 12, 14, 16, and 18 include openings 20 that are sized and shaped for receiving one or more integrated circuit die (not shown). Ground planes 12, 14, 16, and 18 are held together during a manufacturing process by a plurality of tabs 22. The tabs may be thinned by etching so that they are easier to cut later. In a conventional packaging process, frame 10 is attached to a substrate (not shown in FIG. 1). The integrated circuit die are fixed in the openings of the frame. A panelization step is performed to apply a mold compound to the surface of the frame opposite an active surface of the die that is positioned in the frame. Then interconnects are formed and the packaged die are separated from each other by cutting tabs 22.

Figure 2:
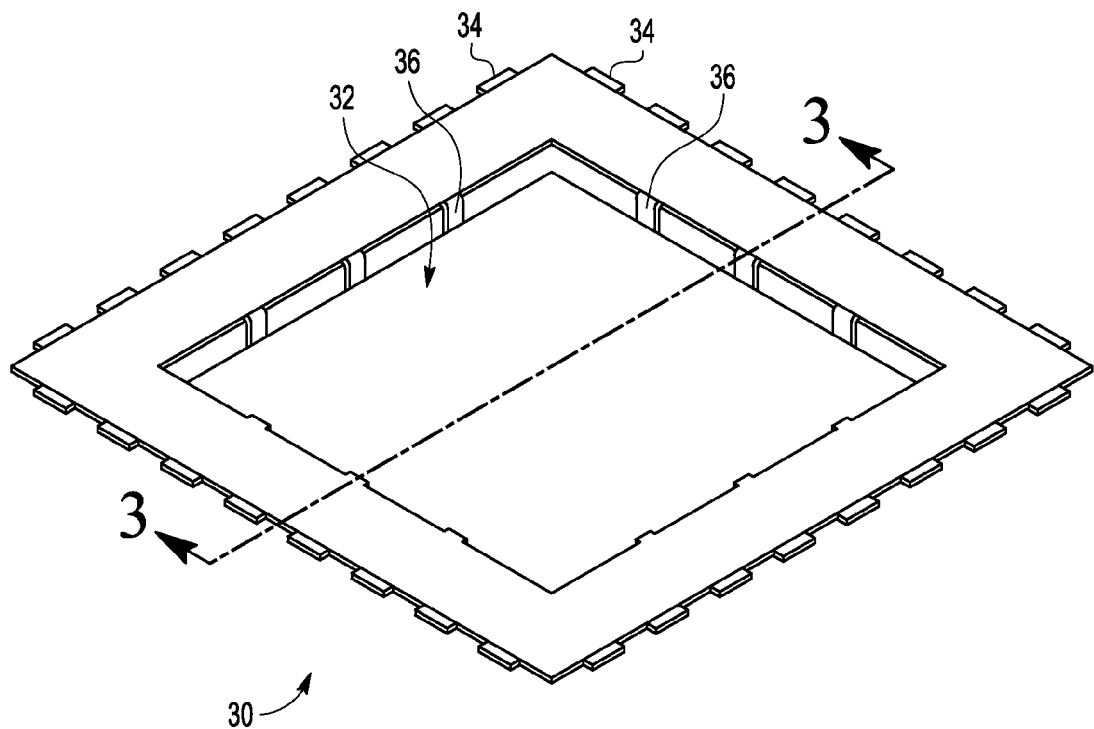
FIG. 2 illustrates an oblique view of a single ground plane for a package in accordance with an embodiment.

FIG. 2 illustrates an oblique view of a single ground plane 30 for an integrated circuit package in accordance with an embodiment. In one embodiment, ground plane 30 is formed from a metal sheet comprising copper. In another embodiment, ground plane 30 may be formed from another type of material that may be a metal or a non-metal. During a manufacturing process, a plurality of ground planes 30 are held together by tabs 34 as illustrated in FIG. 1. Tabs 34 are later cut by sawing, etching, or the like, when the manufacturing process is complete.

Ground plane 30 includes a cap portion 32 that is attached to ground plane 30 by a plurality of tabs 36. The cap 32 is offset from the rest of ground plane 30 by a predetermined amount to form a recessed area for receiving one or more integrated circuit die. Ground plane 30 in the shape illustrated is preferably formed by stamping. The amount of offset is determined by the thickness of the integrated circuit die plus the thickness of the adhesive used to attach the integrated circuit die to the cap. The shape of cap 32 is determined by the dimensions of the one or more die. Preferably, a surface of the integrated circuit die will be even with a surface of the ground plane after attachment. The sides of the recessed area are open except for tabs 36. In another embodiment, the sides of the recessed area may include solid walls instead of tabs 36.

Figure 3:
FIGS. 3-8 illustrate a method for packaging an integrated circuit die in accordance with an embodiment.

FIGS. 3-7 illustrate a method for packaging an integrated circuit die in accordance with an embodiment. FIG. 3 illustrates a cross-sectional view of ground plane 30 of FIG. 2 along the line 3-3. In one embodiment, an RCP manufacturing process starts with a ground plane frame having a plurality of ground planes 30 connected together with tabs 34 as illustrated for the prior art frame of FIG. 1. The recessed area can be seen bounded on the sides by tabs 36 and on the bottom by cap 32. The method will be described using only one ground plane for purposes of simplicity and clarity.

Figure 4:
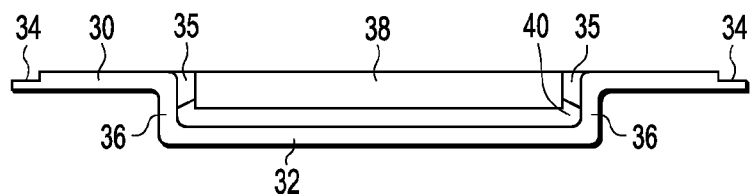

FIG. 4 illustrates a cross-sectional view of ground plane 30 of FIG. 3 after an integrated circuit die 38 has been attached with a thermally conductive adhesive 40. The integrated circuit die 38 has a first surface with active circuitry, a second surface opposite the first surface, and an edge generally orthogonal to the first and second surfaces. The active circuitry is formed on the first surface of die 38 using a conventional integrated circuit manufacturing technique and will not be described further. In one embodiment, the adhesive 40 is first applied to cap 32 and then die 38 is attached to cap 32 with the adhesive. In another embodiment, adhesive 40 may be first applied to die 38 and then die 38 placed in the recessed area and attached to cap 32. A fill material 35, such as epoxy, is deposited in the space between the edge of the die and the sides of the recessed area defined by cap 32 and tabs 36. If necessary, the fill material 35 is smoothed or leveled to provide a flat, gapless transition between ground plane 30 and die 38.

Figure 7:
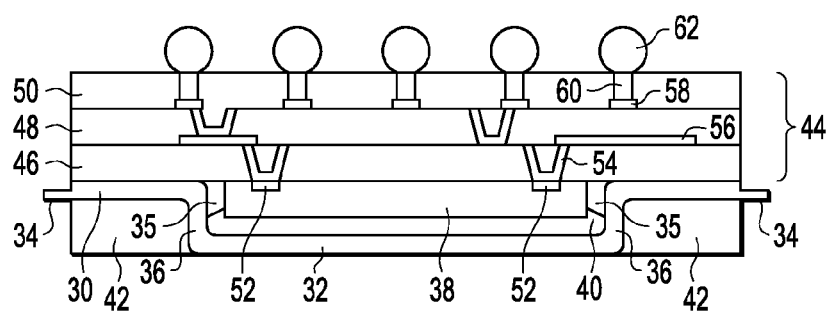
Figure 8:
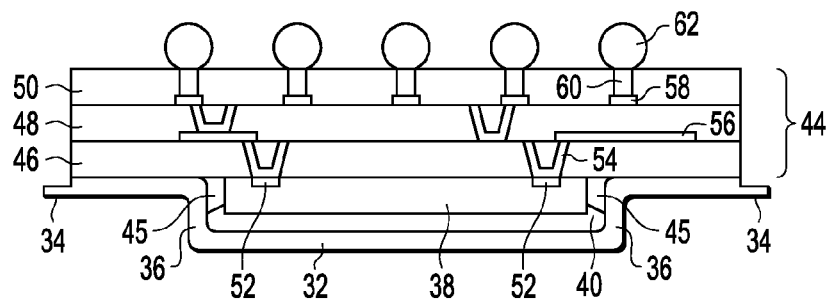

After placing the integrated circuit die, a panelization step can be performed, or the die can be packaged without panelization. Full and partial panelization will be described below in the discussion of FIGS. 5-7. If panelization is not applied, then the next step is to provide electrical interconnects as illustrated in FIG. 8 and described below.

Figure 5:
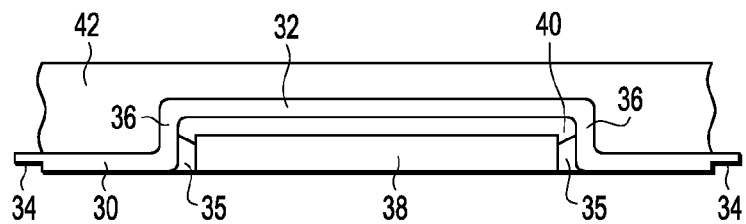
Figure 6:
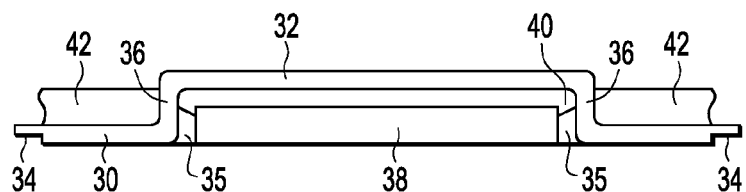

FIG. 5 illustrates a cross-sectional view of ground plane 30 and die 38 of FIG. 4 after full panelization. To provide panelization, an encapsulant mold frame is placed around the perimeter of the ground plane frame. A panelization step is performed by pouring a liquid mold compound over the frame and integrated circuit die within the mold frame. To provide full panelization, the mold compound is poured until cap 32 is covered. To provide partial panelization, the mold compound does not cover cap 32. FIG. 6 illustrates a cross-sectional view of the embedded ground plane of FIG. 4 after partial panelization where the cap protrudes from the mold compound. FIG. 7 provides an example of partial panelization where the mold compound is poured until level with cap 32. After pouring, the mold compound is then cured and leveled.

The amount of panelization is determined by the application. For example, partial panelization, as illustrated in FIGS. 6 and 7, allows a heat spreader (not shown) to be easily attached to cap 32. Full panelization provides more stiffness to the package than partial panelization. After panelization, whether full or partial, the mold frame, substrate, and adhesive are removed and the ground plane and die are turned upside down so that the active side of the die is exposed for further processing.

FIG. 7 illustrates a cross-sectional view of the embedded ground plane of FIG. 4 after partial panelization and formation of interconnect layers 44. The same interconnect layer steps would be used whether full or partial panelization was applied. Interconnect layers 44 includes a plurality of conductive layers separated from each other by insulating layers. There can be any number of layers and they may be formed using a conventional process. Interconnect layers 44 includes dielectric layers 46, 48, and 50 that are used to insulate electrical conductors positioned between the dielectric layers. In the illustrated embodiment, a plated metal comprising copper is used as the conductor. In other embodiments, other conductor types and deposition types can be used. Dielectric layer 46 is deposited on die 38 and ground plane 30. Dielectric layer 46 is patterned to expose contacts 52 on die 38. Contacts 52 may be formed on die 38 during a conventional manufacturing process of die 38. A metal is deposited on dielectric layer 46 to form conductors, such as conductors 54 and 56, to electrically connect integrated circuit die 38 to other circuitry. Also, in some embodiments, it may be desirable to make an electrical connection between the die and the ground plane (not shown). Dielectric layer 48 is then deposited over dielectric layer 46, patterned, and conductors, such as conductor 58, are formed. In the illustrated embodiment, a final dielectric layer 50 is formed over dielectric layer 48 and patterned. A plurality of vias, such as via 60, is formed. Solder balls, such as solder balls 62, are formed on the vias.

FIG. 8 illustrates a cross-sectional view of the embedded ground plane of FIG. 4 with no panelization and after formation of interconnect layers. Interconnect layers 44 in FIG. 8 are formed in the same manner as described above regarding FIG. 7. After the interconnect layers are formed, packaging is complete. The individual packages are separated from each other by cutting through the panelization, if present, and by cutting tabs 34.

Using ground plane 30 with cap 32 provides for a stiffer package and reduces the need for panelization to add stiffness. Also, attaching the die to cap 32 provides better heat transfer for high power devices.

Figure 9:
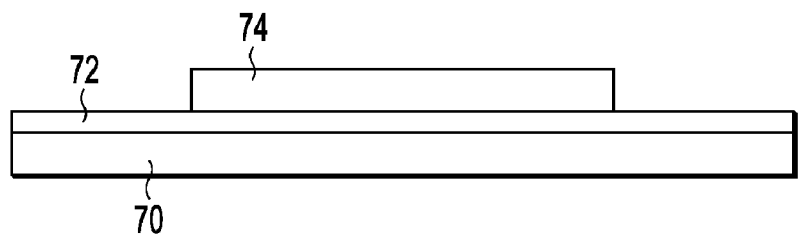
FIGS. 9-12 illustrate a method for packaging an integrated circuit die in accordance with another embodiment.

FIGS. 9-12 illustrate a method for packaging an integrated circuit die in accordance with another embodiment. FIG. 9 illustrates a cross-sectional view of integrated circuit die 74 after being attached to substrate 70 using an adhesive 72. Integrated circuit die 74 has a first surface and a second surface opposite the first surface. An edge of the die is generally orthogonal to the first and second surfaces. Active circuitry is formed on the first surface using a conventional semiconductor processing technique. Die 74 is attached so that the first surface with the active circuitry is attached to the substrate with the adhesive. Substrate 70 and adhesive 72 will be removed and disposed of at the end of the method. In a packaging process according to the disclosed method, a plurality of integrated circuits would be packaged at the same time. However, only one die is shown for the purposes of simplicity and clarity.

Figure 10:
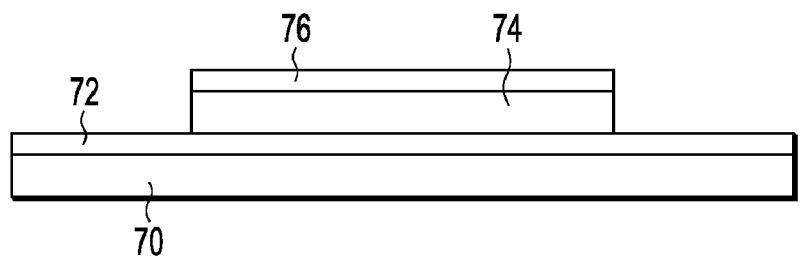

FIG. 10 illustrates a cross-sectional view of integrated circuit die 74 and substrate 70 after thermally conductive adhesive 76 has been applied to the second surface of die 74.

Figure 11:
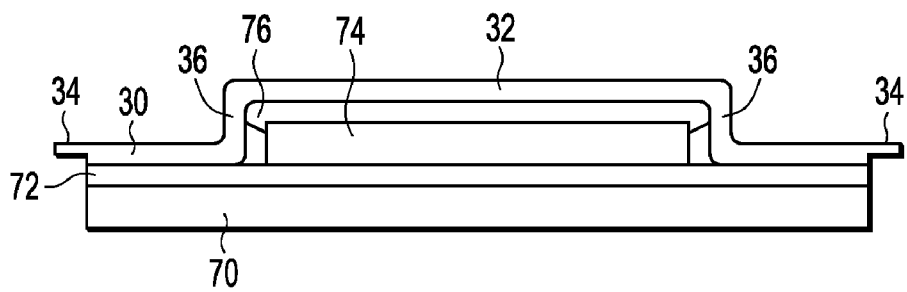

FIG. 11 illustrates a cross-sectional view of integrated circuit die 74 after a ground plane 30 is attached. Ground plane 30 is held in place on the inside surface of cap 32 by thermally conductive adhesive 76. Note that instead of applying adhesive 76 to the second surface of die 74; adhesive 76 may be applied to cap 32 within the recessed area of ground plane 30. The ground plane is attached to the second surface of the die, or the side that does not have active circuitry.

Figure 12:
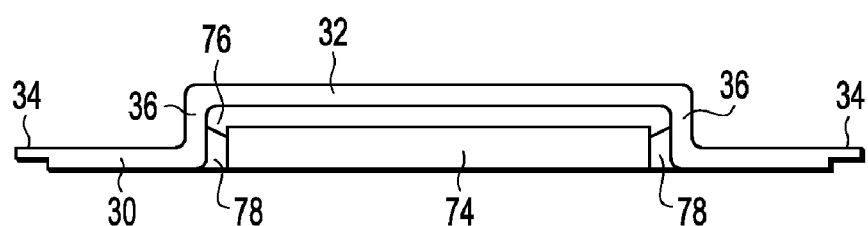

FIG. 12 illustrates a cross-sectional view of integrated circuit die 74 and ground plane 30 after substrate 70 and adhesive 72 have been removed. A filler material 78 is used to fill any spaces between the edge of die 74 and cap 30. After applying the filler material, the method proceeds with full panelization, partial panelization if desired, and then the formation of interconnects. Or, if panelization is not necessary, the method proceeds directly with the formation of interconnects. The panelization steps are illustrated in FIGS. 5, 6, and 7 and the formation of interconnects is illustrated in FIGS. 7 and 8.

Figure 13:
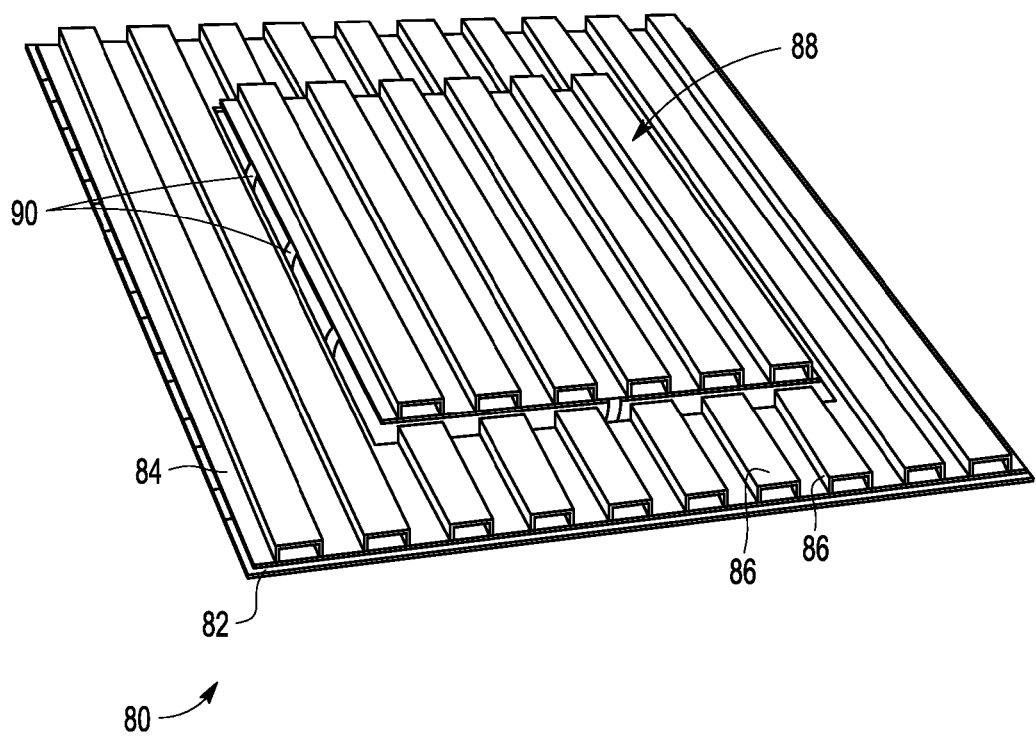
FIG. 13 illustrates an oblique view of a single ground plane for a package in accordance with another embodiment.

FIG. 13 illustrates an oblique view of ground plane 80 for a package in accordance with another embodiment. In one embodiment, ground plane 80 is formed from one or more metal sheets comprising copper. In the illustrated embodiment, ground plane 80 is corrugated and comprises a flat sheet 82 on which a finned sheet 84 is attached. In another embodiment, the ground plane may only comprise one finned sheet. Also, in another embodiment, ground plane 80 may be formed from another type of material that is a metal or a non-metal and have grooves, furrows, or channels formed therein. During a packaging process, a plurality of ground planes 80 are held together by tabs, such as tabs 34 illustrated in FIG. 2 so that a plurality of die can be packaged simultaneously. The tabs are later cut by sawing, etching, or the like, to separate the packaged devices when the packaging process is complete.

Ground plane 80 includes a cap portion 88 that is attached to ground plane 80 by a plurality of tabs 90. The cap 88 is offset from the rest of ground plane 80 by a predetermined amount to form a recessed area for receiving one or more integrated circuit die. Ground plane 80, in the shape illustrated, may be formed by stamping. The amount of offset is determined by the thickness of the integrated circuit die plus the thickness of the adhesive used to attach the integrated circuit die to the cap. Preferably, a surface of the integrated circuit die will be even with a surface of the ground plane after attachment. The sides of the recessed area are open except for tabs 90. In another embodiment, the sides of the recessed area may include solid walls instead of tabs 90. Ground plane 80 may be used in the methods illustrated by FIGS. 3-12 and described above in place of ground plane 30.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an integrated circuit, the method comprising:
    providing a ground plane, the ground plane having a first side, the first side having a recessed area shaped to receive an integrated circuit die, and a second side opposite the first side, wherein the integrated circuit die having a first surface with active circuitry, a second surface, and an edge generally orthogonal to the first and second surfaces;
    attaching the second surface of the integrated circuit die to the recessed area;
    filling a space between the edge of the integrated circuit die and the first side of the ground plane with a fill material;
    forming an encapsulant layer at least partially over the second side of the ground plane;
    forming a first insulating layer on the first side of the ground plane and the first surface of the integrated circuit die;
    patterning the first insulating layer to expose contacts on the first surface of the integrated circuit die; and
    plating electrical conductors on the first insulating layer and the contacts.

2. The method of claim 1, further comprising using a stamping process to form the recessed area in the ground plane.

3. The method of claim 1, wherein the recessed area further comprises a cap portion connected to the ground plane with a plurality of tabs.

4. The method of claim 1, further comprising forming a second insulating layer over the first insulating layer and over the electrical conductors.

5. The method of claim 1, wherein the encapsulant layer covers all of the second side of the ground plane.

6. The method of claim 1, further comprising using a stamping process to form fins and the recessed area on the ground plane.

7. The method of claim 1, wherein the ground plane is corrugated.

8. The method of claim 1, wherein the ground plane comprises a metal.

9. The method of claim 1, further comprising forming solder balls electrically coupled to the electrical conductors.

10. A method for packaging an integrated circuit, the method comprising:
    providing a substrate having a surface;
    attaching an integrated circuit die to the substrate, the integrated circuit die having a first surface with active circuitry, a second surface, and an edge generally orthogonal to the first and second surfaces;
    coupling a ground plane to the substrate and to the second surface of the integrated circuit die, the ground plane having a recessed area shaped to receive the integrated circuit die;
    filling a space between the edge of the integrated circuit die and a side of the recessed area with a fill material;
    removing the substrate from the integrated circuit die and from the ground plane;
    forming an insulating layer on the ground plane and the first surface of the integrated circuit die;
    patterning the insulating layer to expose contacts on the first surface of the integrated circuit die; and
    plating electrical conductors on the insulating layer and the contacts.

11. The method of claim 10, wherein coupling the ground plane to the substrate and to the second surface of the integrated circuit die further comprises attaching the second surface of the integrated circuit die to a bottom of the recessed area with a thermally conductive adhesive.

12. The method of claim 10, further comprising using a stamping process to form the recessed area in the ground plane.

13. The method of claim 10, wherein the recessed area further comprises a cap portion connected to the ground plane with a plurality of tabs.

14. The method of claim 10, further comprising forming fins on the ground plane.

15. The method of claim 10, wherein the ground plane is corrugated.

16. A method for packaging an integrated circuit, the method comprising:
    providing a substrate having a planar surface;
    contacting an integrated circuit die to the planar surface, the integrated circuit die having a first surface with active circuitry, a second surface, and an edge generally orthogonal to the first and second surfaces;
    providing a ground plane, the ground plane having a first side and a second side opposite the first side, the ground plane further comprising a recessed area open on the first side, wherein the recessed area is shaped to receive the integrated circuit die;
    contacting a portion of the first side of the ground plane to the planar surface;
    coupling the recessed area of the ground plane to the second surface of the integrated circuit die;
    removing the integrated circuit die and the ground plane from the substrate;
    filling a space between the edge of the integrated circuit die and a side of the recessed area with a fill material; and
    forming a patterned interconnect layer over the ground plane and the first surface of the integrated circuit die, the patterned interconnect layer coupled to the first surface of the integrated circuit die.

17. The method of claim 16, wherein providing the ground plane further comprises providing a ground plane comprising a metal.

18. The method of claim 16, further comprising forming solder balls electrically coupled to the patterned interconnect layer.

19. The method of claim 16, further comprising forming an encapsulant layer at least partially over the second side of the ground plane.

20. The method of claim 16, further comprising forming an encapsulant layer over the second side of the ground plane.

* * * * *